US009099594B2

(12) United States Patent
Tanaka (10) Patent No.: US 9,099,594 B2
(45) Date of Patent: Aug. 4, 2015

(54) NITRIDE SEMICONDUCTOR LIGHT-EMITTING ELEMENT

(71) Applicant: KABUSHIKI KAISHA TOSHIBA, Minato-ku, Tokyo (JP)

(72) Inventor: Akira Tanaka, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/779,823

(22) Filed: Feb. 28, 2013

(65) Prior Publication Data

US 2014/0014895 A1   Jan. 16, 2014

(30) Foreign Application Priority Data

Jul. 12, 2012   (JP) .................................. 2012-156687

(51) Int. Cl.
| | |
|---|---|
| *H01L 33/06* | (2010.01) |
| *H01L 33/14* | (2010.01) |
| *H01L 33/38* | (2010.01) |
| *H01L 33/42* | (2010.01) |
| H01L 33/08 | (2010.01) |

(52) U.S. Cl.
CPC .............. *H01L 33/06* (2013.01); *H01L 33/145* (2013.01); *H01L 33/38* (2013.01); *H01L 33/42* (2013.01); *H01L 33/08* (2013.01); *H01L 33/382* (2013.01); *H01L 33/387* (2013.01)

(58) Field of Classification Search
CPC ....... H01L 33/32; H01L 33/382; H01L 33/38; H01L 33/387

USPC ................................................ 257/13, 76, 88
See application file for complete search history.

(56) References Cited

U.S. PATENT DOCUMENTS

| | | | |
|---|---|---|---|
| 7,420,218 B2 | 9/2008 | Nagai | |
| 8,106,412 B2 | 1/2012 | Takao et al. | |
| 2006/0231852 A1* | 10/2006 | Kususe et al. | 257/99 |
| 2010/0295086 A1* | 11/2010 | Shinohara et al. | 257/98 |
| 2011/0018024 A1 | 1/2011 | Fukshima et al. | |
| 2012/0018764 A1* | 1/2012 | Choi et al. | 257/99 |

FOREIGN PATENT DOCUMENTS

| | | | |
|---|---|---|---|
| JP | 2001-068728 A | 3/2001 | |
| JP | 2003-163367 A | 6/2003 | |
| JP | 2005-235798 A | 9/2005 | |
| JP | 2007-036077 A | 2/2007 | |

* cited by examiner

Primary Examiner — Whitney T Moore (74) Attorney, Agent, or Firm — Posz Law Group, PLC (57) ABSTRACT

According to one embodiment, a nitride-semiconductor light-emitting element includes a laminated body, a pair of two transparent conductive layers, a current-blocking layer, a first electrode, and a second electrode. The laminated body includes a nitride semiconductor, a first layer including a first conductivity-type layer, a second layer including a second conductivity-type layer, and a light-emitting layer sandwiched between the first layer and the second layer. The two transparent conductive layers are laterally separated from each other by a prescribed region. The prescribed region is a portion of a surface of the first layer. The current-blocking layer covers respective surfaces of the two transparent conductive layers.

6 Claims, 9 Drawing Sheets

NITRIDE SEMICONDUCTOR LIGHT-EMITTING ELEMENT

CROSS REFERENCE TO RELATED APPLICATION

This application is based upon and claims the benefit of priority from the prior Japanese Patent Application No, 2012-156687, filed on Jul. 12, 2012, the entire contents of which are incorporated herein by reference.

FIELD

Embodiments described herein are generally related to a nitride semiconductor light-emitting element.

BACKGROUND

Nitride semiconductor light-emitting elements are widely used for lighting systems, display devices, traffic lights, etc.

The light-emitting elements are needed to have lower operating voltages and higher light outputs for these purposes. When narrow electrodes are formed to be dispersed on an upper surface of a light-emitting layer, and a reflection layer is further formed on a lower surface thereof; it is enabled to efficiently extract light emitted from the light-emitting layer at the upper surface and easily enhance light outputs.

Unfortunately, carrier inhomogeneous injection into a narrow region of the light-emitting layer or an increase in a rate of light blocked by the electrodes on the upper surface makes it difficult to increase the light outputs.

BRIEF DESCRIPTION OF THE DRAWINGS

The accompanying drawings, which are incorporated in and constitute a portion of this specification, illustrate embodiments of the invention and together with the description, serve to explain the principles of the invention.

DETAILED DESCRIPTION

According to one embodiment, a nitride-semiconductor light-emitting element includes a laminated body, a pair of two transparent conductive layers, a current-blocking layer, a first electrode, and a second electrode. The laminated body includes a nitride semiconductor, a first layer including a first conductivity-type layer, a second layer including a second conductivity-type layer, and a light-emitting layer sandwiched between the first layer and the second layer. The two transparent conductive layers are laterally separated from each other by a prescribed region. The prescribed region is a portion of a surface of the first layer. The current-blocking layer covers respective surfaces of the two transparent conductive layers. The first electrode is entirely formed such that the first electrode is in contact with the sidewalls of the two transparent conductive layers, and covers the current-blocking layer and regions uncovered with the current-blocking layer. The second electrode is formed on a second region in a surface of the second layer. The second region is just above the prescribed region.

An embodiment will be described with reference to drawings. In the drawings, the same reference numerals denote the same or similar portions.

Figure 1A:
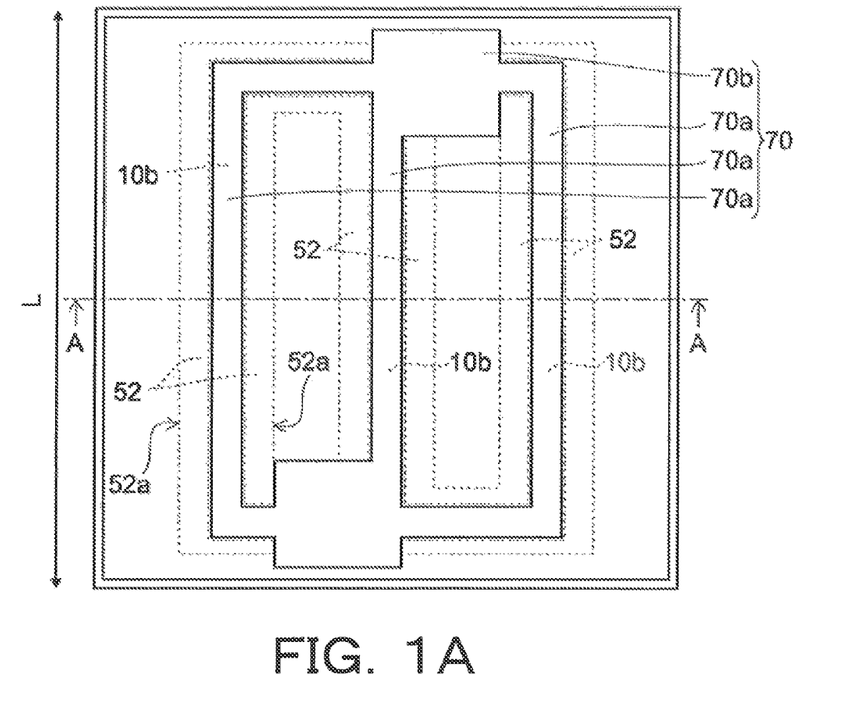
FIG. 1A is a schematic plan view showing a nitride semiconductor light-emitting element according to a first embodiment.
Figure 1B:
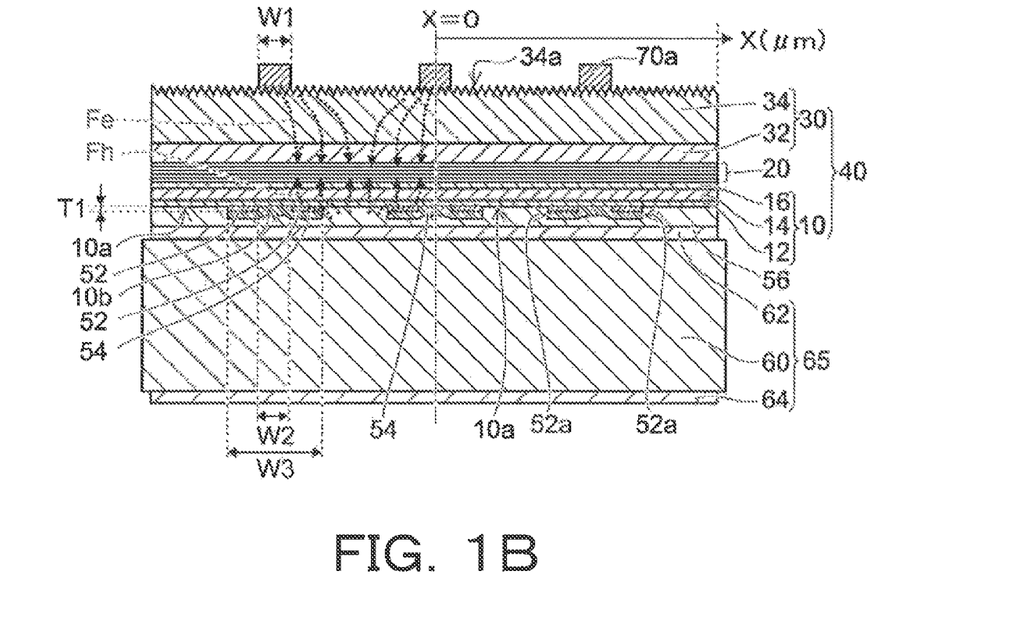
FIG. 1B is a schematic sectional view taken along the A-A line.

FIG. 1A is a schematic plan view showing a nitride semiconductor light-emitting element in accordance with a first embodiment. FIG. 1B is a schematic sectional view taken along the A-A line. The light-emitting element includes a light-emitting layer 20, a laminated body 40 including nitride semiconductors, a transparent conductive layer 52, a current-blocking layer 54, a first electrode 56, and a second electrode 70. The second electrode 70 includes a thin line 70a and a pad 70b.

The laminated body 40 includes a first layer 10, a second layer 30, and a light-emitting layer 20 sandwiched therebetween. The first layer 10 is assumed as a p-type layer in the first embodiment. Alternatively, the first layer 10 may include an n-type layer.

The first layer 10 is made up of nitride semiconductors, and includes a contact layer 12, a clad layer 14, and an overflow-preventing layer 16. The contact layer 12 includes a $p^+$-type GaN layer 100 nm thick with an acceptor density of $1\times10^{21}$ $cm^{-3}$. The clad layer 14 includes a p-type GaN layer 100 nm thick with an acceptor density of $1\times10^{20}$ $cm^{-3}$. The overflow-preventing layer 16 includes a p-type AlGaN layer 5 nm thick with an acceptor density of $1\times10^{20}$ $cm^{-3}$.

The light-emitting layer 20 is made up of nitride semiconductors, and includes an undoped MQW structure of InGaN/

InGaN (Multiple Quantum Well) with four 3-nm-thick well layers, each being sandwiched between two 5-nm-thick barrier layers.

The second layer 30 is made up of nitride semiconductors, and includes a superlattice layer 32 and a second conductivity-type layer 34. The superlattice layer 32 is disposed on the side of the light-emitting layer 20 and includes InGaN/InGaN undoped layers, which is a laminated body including 30 pairs of a well layer 1 nm thick and a barrier layer 3 nm thick. The second conductivity-type layer 34 includes an n-type GaN layer 6 µm thick with a donor density of $4 \times 10^{18}$ cm$^{-3}$. The second conductivity-type layer 34 serves as a clad layer or a current diffusion layer. When the first layer is an n-type layer, the second conductivity-type layer 34 can include a p-type layer.

The transparent conductive layers 52 are formed at both sides of a predetermined region 10b. The region 10b is a portion of a surface 10a of the first layer 10. Two transparent conductive layers 52 are laterally separated from each other by the region 10b. The thin line 70a is located just above the region 10b and on the second layer 30. The thin line 70a is smaller in width than the region 10b. The current-blocking layer 54 including SiO$_2$ and SiN (Si$_3$N$_4$ included) is formed as to cover two transparent conductive layers 52 separated from each other and the region 10. Alternatively, the current-blocking layer 54 may be made up of an n-type GaN layer with a conductivity-type that is different from that of the first layer 10. Sidewalls 52a of the two transparent conductive layers 52 are exposed at the outer edge of the current-blocking layer 54.

The transparent conductive layers 52 can include a laminated body or a metal oxide film. The laminated body is made up of an insulating layer and a thin metal layer in contact with the contact layer 12.

The transparent conductive layer 52 may include a metal oxide film, such as ITO (Indium Tin Oxide). Resistivity of ITO is about $1.5 \times 10^{-4}$ Ω·cm, for example. Resistivity of Au (gold) is about $2.2 \times 10^{-6}$ Ω·cm. Resistivity of Ag (silver) is about $1.6 \times 10^{-6}$ Ω·cm. ITO has 100 times the resistivity of Ag.

Meanwhile, resistivity of a nitride semiconductor depends greatly on its carrier density. For example, mobility (µ) of n-type GaN changes in the range from several tens to one thousand and several hundreds of cm$^2$/(V·s). The mobility of p-type GaN changes in the range from several to one hundred of cm$^2$/(V·s). Resistivity (=1/(e·p·µ)) of p-type GaN doped up to $1 \times 10^{20}$ cm$^{-3}$ is $7.8 \times 10^{-3}$ Ω·cm or higher. In addition, "e" denotes an electric charge of an electron. The resistivity of the transparent conductive layer 52 can be easily higher than the resistivity of the first electrode 56, and lower than the resistivity of the first layer 10 included in the laminated body 40. This resistivity relation in the first embodiment laterally broadens carrier-flowing paths for carrier flows Fe (electrons) and Fh (holes), both being injected into the light-emitting layer 20 as shown in FIG. 1B that shows a cross section perpendicular to the thin line 70a. Alternatively, a thin metal layer may broaden current laterally, because the thin metal layer increases a sheet resistance. A thickness T1 of the transparent conductive layer 52 needs to be about one hundredth of the thickness of the first electrode 56.

When a width W1 of the thin line 70a is 8 µm, a width W2 of the region 10b is larger than the width W1, being 8 to 12 µm. When the transparent conductive layer 52 is made up of ITO, the thickness T1 is 0.15 µm, for example. The current-blocking layer 54 of insulators including SiO$_2$ is formed just on a pair of two transparent conductive layers 52 and a portion of the contact layer 12 between the pair, so that the current-blocking layer 54 covers the pair and the portion. Sidewalls at the outer edge 52a of the transparent conductive layer 52 are not covered with the current-blocking layer 54. A width W3 of the current-blocking layer 54 is set to 32 µm, for example. The first electrode 56 is formed such that the first electrode 56 is in contact with the sidewalls at the outer edge 52a of the transparent conductive layer 52 to cover the current-blocking layer 54 and regions uncovered with the current-blocking layer 54.

Alternatively, the nitride semiconductor light-emitting element may have a support 65. The support 65 has an upper electrode 62 on one surface of a conductive substrate 60 including Si and a lower electrode 64 on the other. For example, wafer direct bonding is conducted to bond the first electrode 56 and the upper electrode 62 of the support 65. When a sapphire substrate remains as a crystal growth substrate on a surface of the laminated body 40 on the opposite side of the first electrode 56, the sapphire substrate is removed to form a concavoconvex surface 34a on the exposed surface of the second conductivity-type layer 34. The thin line 70a may be formed on the concavo-convex surface 34a. The concavo-convex surface 34a reduces total reflections on the upper surface of the second layer 30 to enhance efficiency of light extraction from the concavo-convex surface 34a to the upper outside. The second conductivity-type layer 34 with the concavoconvex surface 34a is 4 to 5 µm in thickness.

When the first electrode 56 is made up of Au, Ag, etc., light emitted from the light-emitting layer 20 to the lower side will be reflected at the first electrode 56 to thereby enhance efficiency of light extraction from the upper side. The substrate 60 has current paths between the first electrode 56 and the lower electrode 64 and serves as the support 65 to keep the mechanical strength of the light-emitting element.

In the first embodiment, the current paths broaden laterally between the first electrode 56 and the second electrode 70 having the thin lines 70a, depending on a region in contact with the transparent conductive layer 52. A thin transparent conductive layer 52 broadens the hole-flow Fh laterally to produce a laterally broad distribution of holes inside the light-emitting layer 20. The laterally broadened distribution reduces the carrier density to prevent Auger recombination, which is non-radiative recombination, thereby enhancing luminous efficiency. Effects of the transparent conductive layer 52 will be described later.

Figure 2:
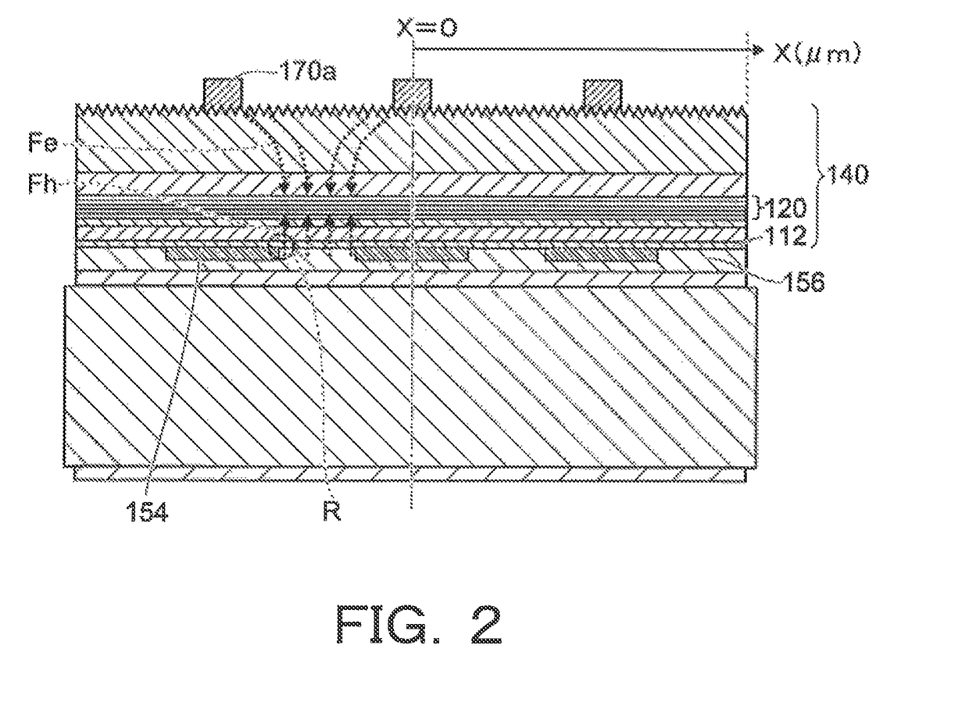
FIG. 2 is a schematic sectional view showing a nitride semiconductor light-emitting element according to a first comparative example.

FIG. 2 is a schematic sectional view showing a nitride semiconductor light-emitting element in accordance with a first comparative example. The comparative example lacks a transparent conductive layer between a current-blocking layer 154 and a laminated body 140. For this reason, current paths do not broaden laterally above the current-blocking layer 154. As a result, light emission arises in an outer region of the current-blocking layer 154 to reduce an amount of light shielding due to a thin line 170a. The paths of the carrier flow Fe, however, becomes longer within the laminated body 140 to raise the operating voltage, thereby reducing luminous efficiency. Mobility of holes injected from the first electrode 156 is so low that holes tends to concentrate at edges R at both sides of the current-blocking layer 154, so that Auger recombination increases to reduce luminous efficiency.

Figure 3A:
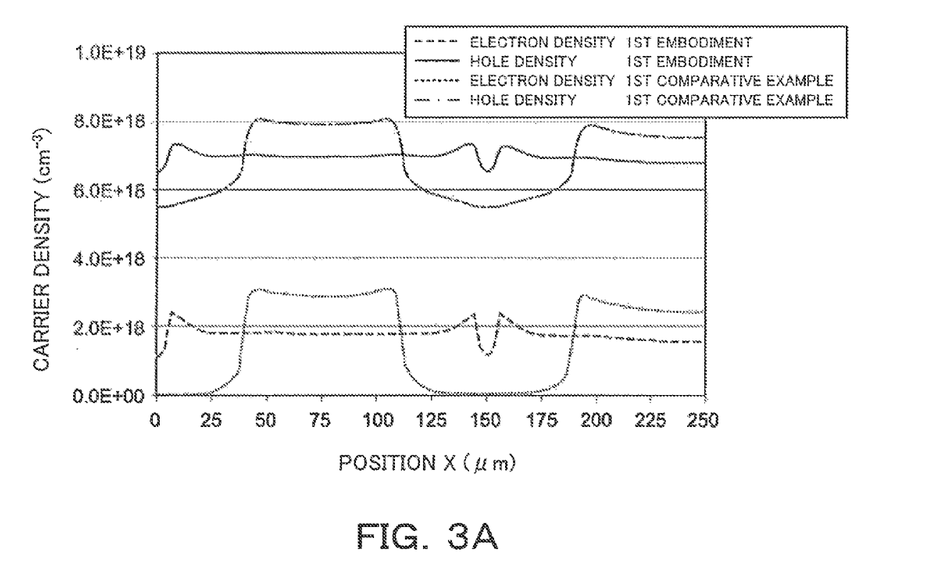
FIG. 3A is a graph showing a distribution of carrier density.
Figure 3B:
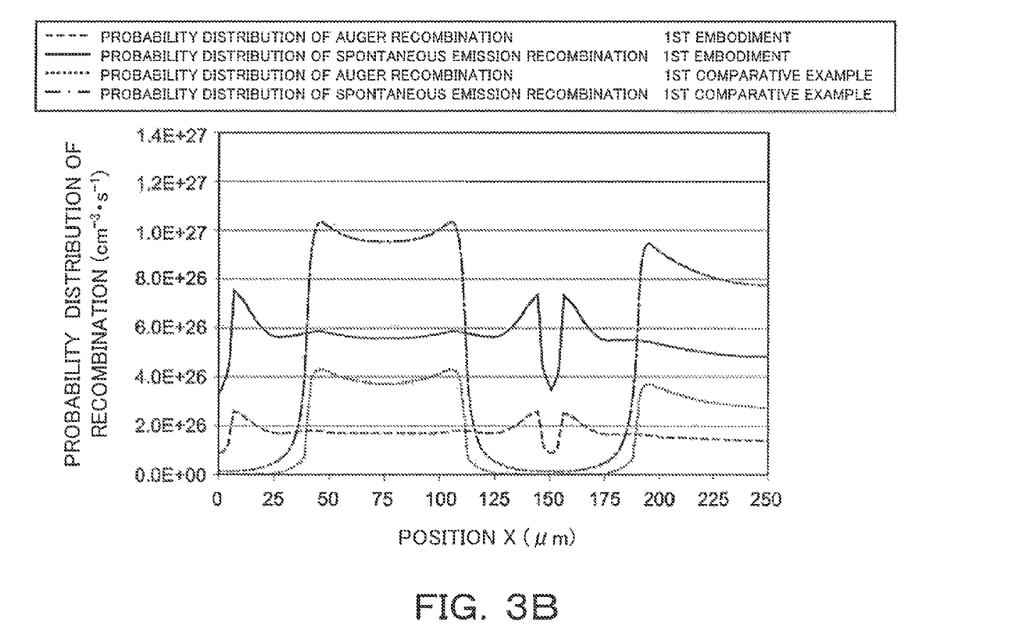
FIG. 3B is a graph showing a distribution of recombination probability.

FIG. 3A is a graph showing a distribution of carrier density. FIG. 3B is a graph showing a distribution of recombination probability. Carriers, both electrons and holes, tend to concentrate at well layers on the side of the p-type layer. The graph of FIG. 3 shows a distribution of carrier density in the central portion of the well layer nearest to the p-type layer. In FIG. 3A, the vertical axis denotes carrier density distribution (cm$^{-3}$); and the horizontal axis denotes a location (µm) from the center line of a chip of the light-emitting element. The solid line denotes hole density, and the dotted line denotes electron density in the first embodiment. The chain line denotes hole density, and the dotted line denotes electron density in the first comparative example. The chip size is assumed as being 500 μm×500 μm.

In the first comparative example, holes and electrons are injected intensively into a light-emitting layer 120, which is located above the contact interface between the first electrode 156 and the contact layer 112. For this reason, the densities of holes and electrons are at a maximum around the edges R of the current-blocking layer 154. By contrast, holes are injected broadly into a portion of the light-emitting layer 20 when viewed from above. The portion is right above the transparent conductive layer 52 in the first embodiment. For this reason, the hole density broadens from the central to the outer; and shows a lower average. Meanwhile, electrons diffuse through the second layer 30.

In FIG. 3B, the vertical axis denotes recombination-probability distribution ($cm^{-3} \cdot s^{-1}$); and the horizontal axis denotes a location X (μm) from the center line of a chip of the light-emitting element. The solid line denotes spontaneous-emission-recombination-probability distribution; and the dotted line denotes the Auger-recombination-probability distribution in the first embodiment. The chain line denotes the spontaneous-emission-recombination-probability distribution, and the dotted line denotes the Auger-recombination-probability-distribution in the first comparative example.

The Auger recombination gives energy produced by recombination to other carriers to cause non-radiative recombination, thereby reducing luminous efficiency. The higher electron density or hole density, the higher the Auger-recombination probability. The spontaneous emission (radiative) recombination probability is about 2.5 times higher than the Auger-recombination probability in the first comparative example having relatively high carrier density. By contrast, the spontaneous emission (radiative) recombination probability is about 3 times higher than the Auger-recombination probability in the first embodiment having relatively low carrier density. The first embodiment therefore has higher radiative recombination probability than the first comparative example to thereby enhance luminous efficiency.

Figure 4A:
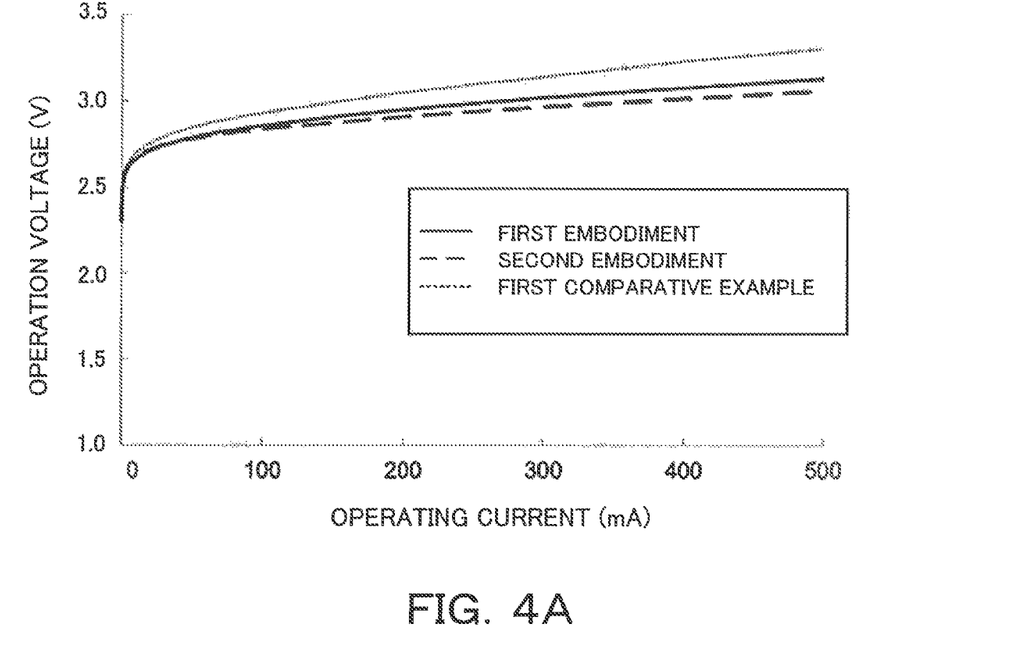
FIG. 4A is a graph showing dependence of the operating voltage on operating current.
Figure 4B:
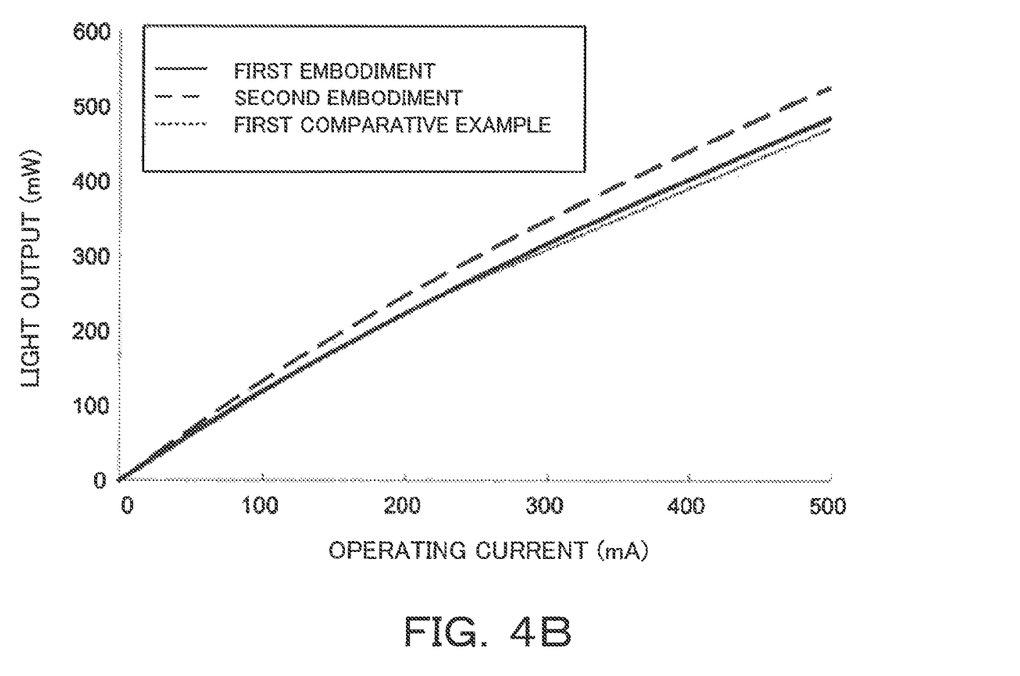
FIG. 4B is a graph showing dependence of the light output on the operating current.

FIG. 4A is a graph showing dependence of the operating voltage on operating current. FIG. 4B is a graph showing dependence of the light output on the operating current. The dotted line denotes the first comparative example. The solid line denotes the first embodiment. The dashed line denotes a second embodiment, which will be described later. In FIG. 4A, the first embodiment shows an operating voltage of about 3.1 V at an operating current of 500 mA, whereas the first comparative example shows an operating voltage of about 3.1 V at the same current. The first embodiment achieves lower operating voltage. This is due to the thin transparent conductive layer 52 that laterally broadens hole-injecting paths for recombination. In FIG. 4B, the first embodiment shows a light output of about 480 mW at an operating current of 500 mA, whereas the first comparative example shows a light output of about 460 mW at the same current. The first embodiment achieves higher light output. As a result, the first embodiment approximately achieves 11% enhancement of luminous efficiency in comparison with the first comparative example.

Figure 5:
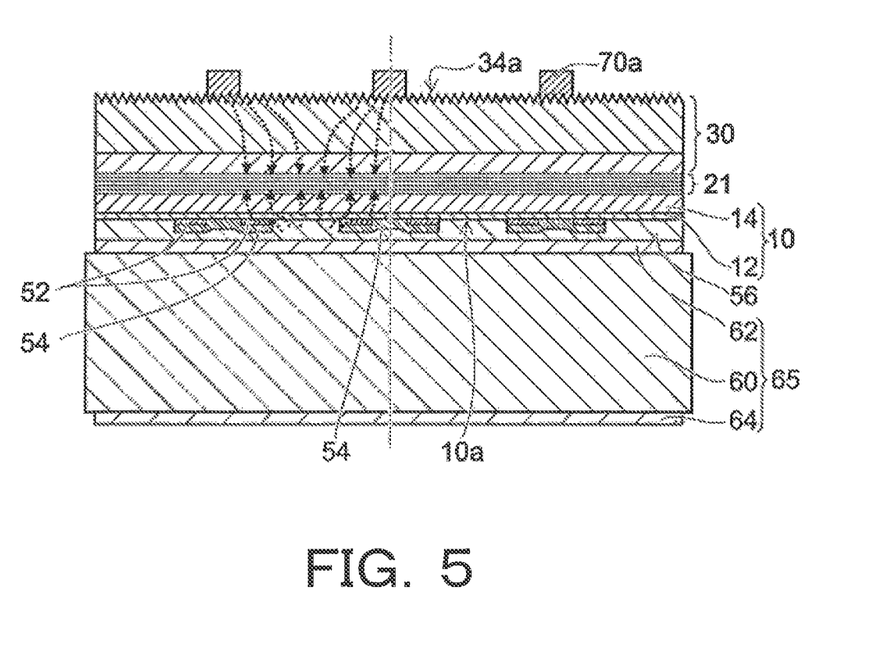
FIG. 5 is a schematic sectional view showing a nitride semiconductor light-emitting element according to a second embodiment.

FIG. 5 is a schematic sectional view showing a nitride semiconductor light-emitting element in accordance with a second embodiment. In the second embodiment, barrier layers included in MQW for a light-emitting layer 21 are exclusively modulation-doped with a second conductivity-type dopant ($2 \times 10^{18}$ $cm^{-3}$). The modulation doping laterally broadens electron-injecting paths within the light emitting layer 21. A structure eliminating the needs for an overflow-preventing layer contributes to lateral broadening of hole-injecting paths. As a result, the second embodiment achieves a low operating voltage of about 3.05 V at 500 mA as shown in FIG. 4A. The second embodiment also achieves a high light output of about 525 mW at 500 mA as shown in FIG. 4B. As a result, the second embodiment approximately achieves 24% enhancement of luminous efficiency in comparison with the first comparative example.

Figure 6A:
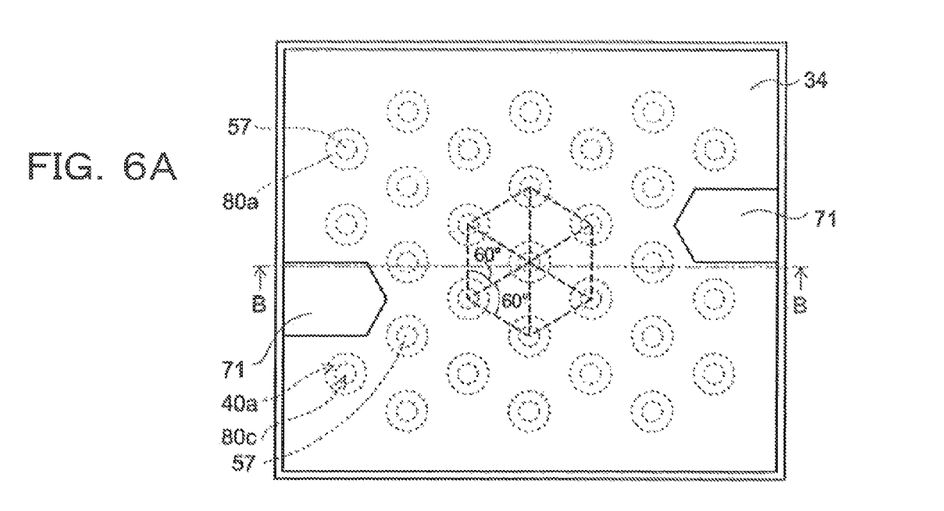
FIG. 6A is a schematic plan view showing a nitride semiconductor light-emitting element according to a third embodiment.
Figure 6B:
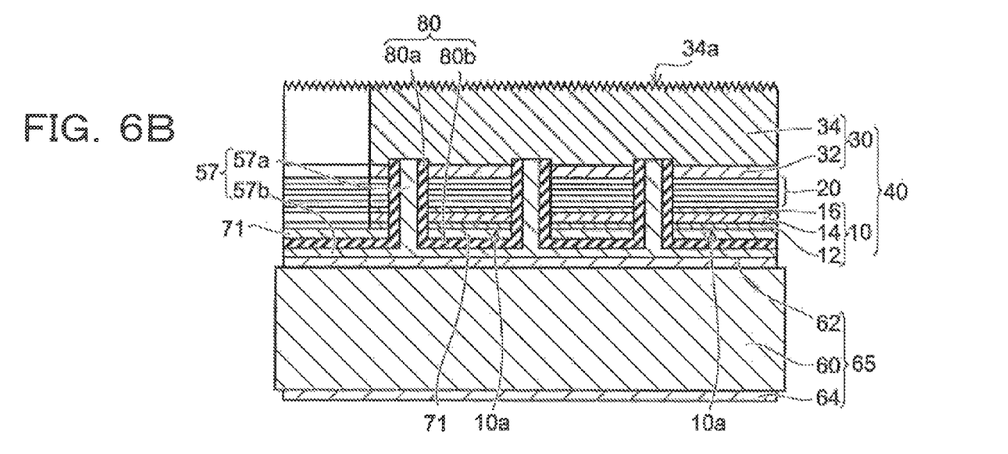
FIG. 6B is a schematic sectional view taken along the B-B line.
Figure 6C:
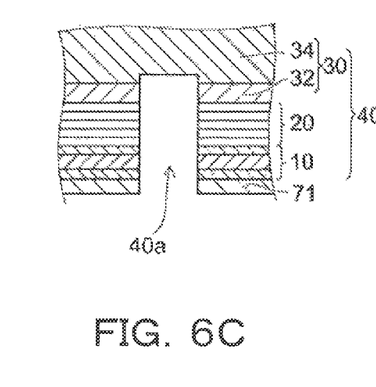
FIG. 6C is a schematic sectional view showing a concave of a laminated body.
Figure 6D:
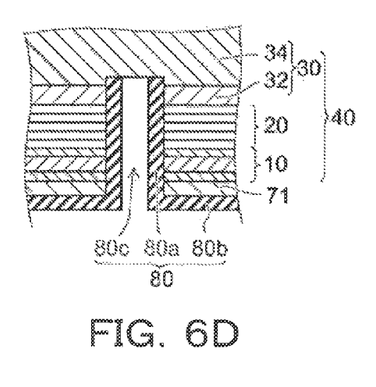
FIG. 6D is a schematic sectional view showing a concave of an insulating film.

FIG. 6A is a schematic plan view showing a nitride semiconductor light-emitting element in accordance with a third embodiment. FIG. 6B is a schematic sectional view taken along the B-B line. FIG. 6C is a schematic sectional view showing a concave of a laminated body. FIG. 6D is a schematic sectional view showing a concave of an insulating film. The nitride semiconductor light-emitting element includes the laminated body 40 made up of nitride semiconductor, a first electrode 57, a second electrode 71, and an insulating film 80. The laminated body 40 includes the light-emitting layer 20. Alternatively, the laminated body 40 may include a light-emitting layer 21 instead of the light-emitting layer 20.

The laminated body 40 includes a first layer 10 including a first conductivity-type layer, a second layer 30 including a second conductivity-type layer, and the light-emitting layer 20 sandwiched between the first layer 10 and the second layer 30. The laminated body 40 is provided with a center of a regular hexagon denoted by a dotted line and two or more concave portions 40a. The concave portions 40a are disposed at the respective corners of the hexagon, and reach portions of the second layer 30 from the surface of the first layer 10. The concave portions 40a shown in FIGS. 6A to 6C are 1 to 10 μm in size, and formed such that the second conductivity-type layer 34 is exposed. Although the first layer 10 is a p-type semiconductor layer, the first layer 10 is not limited to this in the third embodiment.

The first layer includes a contact layer 12, a clad layer 14, and an overflow-preventing layer 16. The contact layer 12 has an acceptor density of $1 \times 10^{21}$ $cm^{-3}$, and is 5 nm in thickness. The clad layer 14 has an acceptor density of $1 \times 10^{20}$ $cm^{-3}$, and is 100 nm in thickness. The overflow-preventing layer 16 has an acceptor density of $1 \times 10^{20}$ $cm^{-3}$, and is 5 nm in thickness.

Alternatively, the light-emitting layer 20 may include an undoped MQW with four 5-nm-thick well layers, each being sandwiched between two 5-nm-thick barrier layers.

The second layer 30 includes a superlattice layer 32 and a second conductivity-type layer 34. The superlattice layer 32 is disposed on the side of the light-emitting layer 20 and includes InGaN/InGaN undoped layers, which is a laminated body including 30 pairs of a 1-nm-thick well layer and a 3-nm-thick barrier layer. The second conductivity-type layer 34 includes a 6-μm-thick n-type-GaN layer with a donor density of $4 \times 10^{19}$ $cm^{-3}$. Alternatively, the first layer 10 may be an n-type layer; and the second conductivity-type layer 34 may include a p-type layer. Forming the concavoconvex surface 34a on the light-extracting surface of the second conductivity-type layer 34 enhances efficiency of light extraction.

The first electrodes 57 are dispersed inside the laminated body 40 to include a flat portion 57b and a connection 57a connected to a remained portion of the second layer 30. The second electrode 71 is formed on the surface 10a of the first layer 10. The connection 57a protrudes into the second layer 30 by a prescribed height. When the second electrode 71 is made up of Au, Ag, etc., light emitted from the light-emitting layer 20 to the lower side will be reflected at the second electrode 71 to thereby enhance efficiency of light extraction from the upper side.

The insulating film 80 is formed as to expose a portion of the second layer 30 to the bottom of the concave 40a of the laminated body 40 and simultaneously cover the sidewall of the concave 40a and the surface of the second electrode 71. As shown in FIG. 6D, the insulating film 80 is provided with a concave 80c that includes the connection 57a of the first electrode 57 in inside of the concave 80c. The insulating film 80 has a filling portion 80a and a flat portion 80b. The filling portion 80a surrounds the connection 57a of the first electrode 57. The flat portion 80b is on the surface of the second electrode 71. The connections 57a of the first electrode 57 are formed as to be islands along inside surfaces of two or more concaves 80c.

Alternatively, the nitride semiconductor element may have a support 65. The support 65 has an upper electrode 62 on one surface of a substrate 60 and a lower electrode 64 on the other. Wafer direct bonding is conducted to bond the first electrode 57 on the side of the laminated body 40 and the upper electrode 62 of the support 65.

Figure 7A:
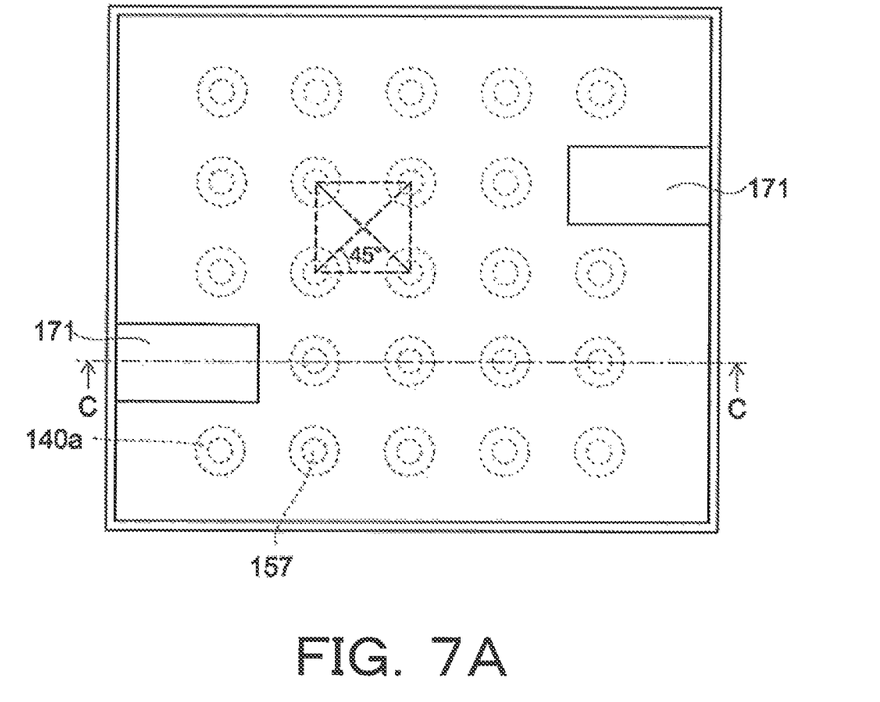
FIG. 7A is a schematic plan view showing a nitride semiconductor light-emitting element according to a second comparative example.
Figure 7B:
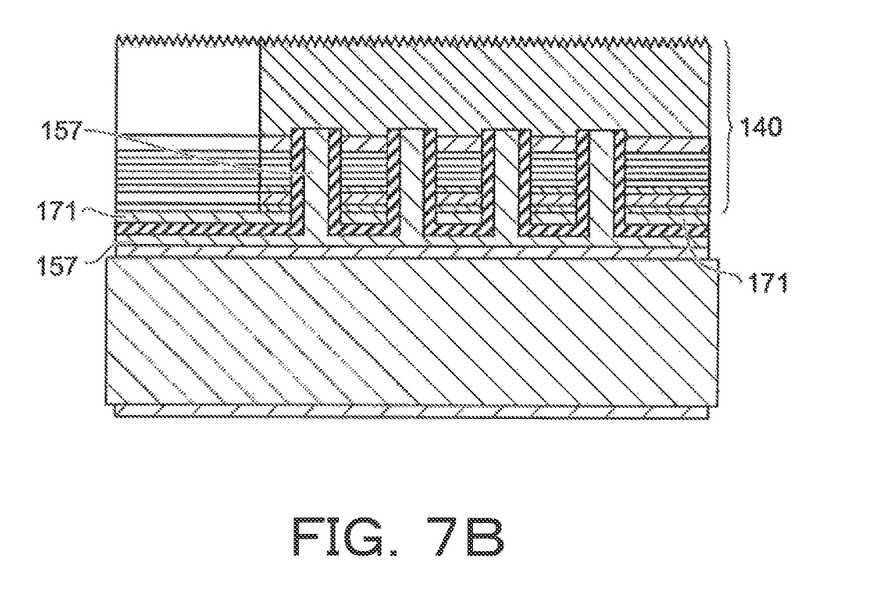
FIG. 7B is a schematic sectional view taken along the C-C line.

FIG. 7A is a schematic plan view showing a nitride semiconductor light-emitting element in accordance with a second comparative example. FIG. 7B is a schematic sectional view taken along the C-C line. First concaves 140a are located at corners of the quadrate denoted by the dashed line, and at intervals of 10 to 100 μm. Electrons and holes, which are injected from the first electrode 157 and the second electrode 171, respectively, recombine with spontaneous emission to emit light. High carrier density at the recombination increases nonradiative Auger recombination probability to decrease luminous efficiency.

The carrier density can change with a distance between two adjacent first electrodes 157. When the first electrodes 157 are located at corners of quadrates as shown in FIG. 7A, the distance between two adjacent first electrodes 157 is longer in the diagonal direction than in the vertical or horizontal direction. It is, therefore, difficult to control the carrier density in all directions including horizontal, orthogonal, and vertical directions, thereby causing inhomogeneous carrier density to decrease luminous efficiency.

By contrast, the third embodiment arranges each first electrode 57 at six corners of regular hexagons to make distances in the six directions between two adjacent first electrodes 67 become equal to each other. As a result, the hexagonal arrangement as shown in FIG. 6A includes 29 first electrodes 57, whereas the quadrate arrangement as shown in FIG. 7A includes 23 first electrodes 157 in the same chip size. Thus, arranging the first electrodes 57 at the corners of the regular hexagon enables the distribution of the carrier density to be more homogeneous to enhance the luminous efficiency and the light output.

Figure 8:
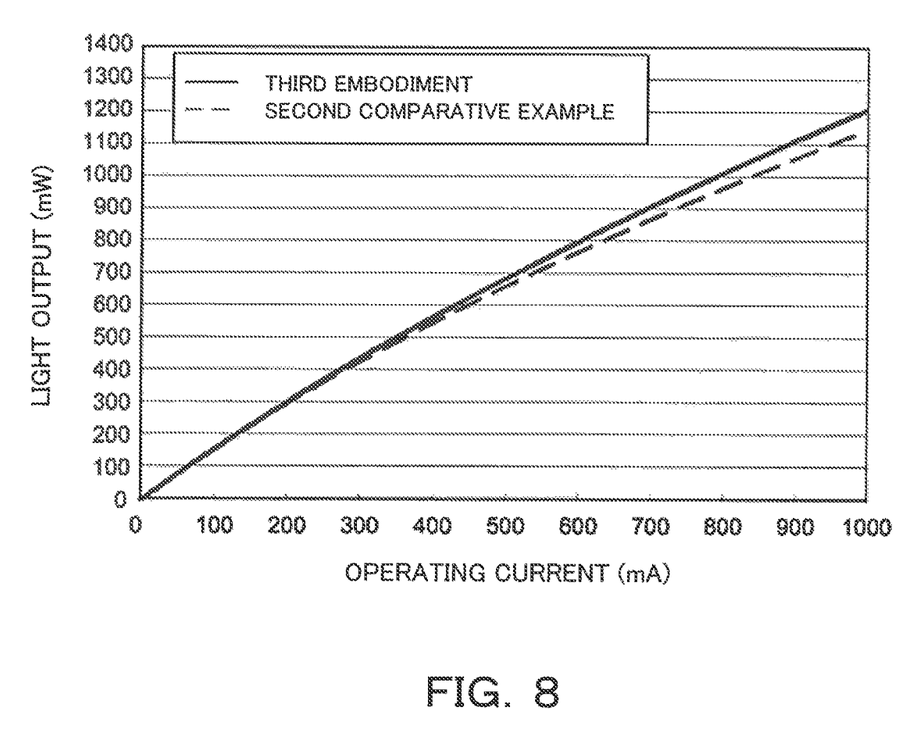
FIG. 8 is a graph showing dependence of the light outputs on the operating current as a result of simulation.

FIG. 8 is a graph showing dependence of the light outputs on the operating current as a result of simulation. As denoted by the dotted line in the graph, the second comparative example shows a light output of 1025 mW at an operating current of 1000 mA. By contrast, the third embodiment shows a light output of 1120 mW, which is about 8% higher than that of the second comparative example. This enhancement of the light output comes probably from the more homogeneous distribution of carrier density in the light-emitting layer.

Figure 9A:
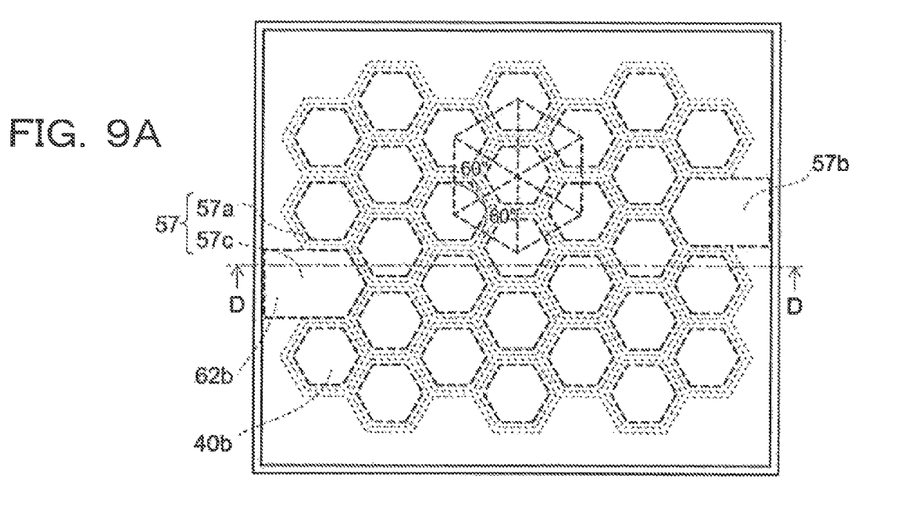
FIG. 9A is a schematic plan view showing a nitride semiconductor light-emitting element according to a fourth embodiment.
Figure 9B:
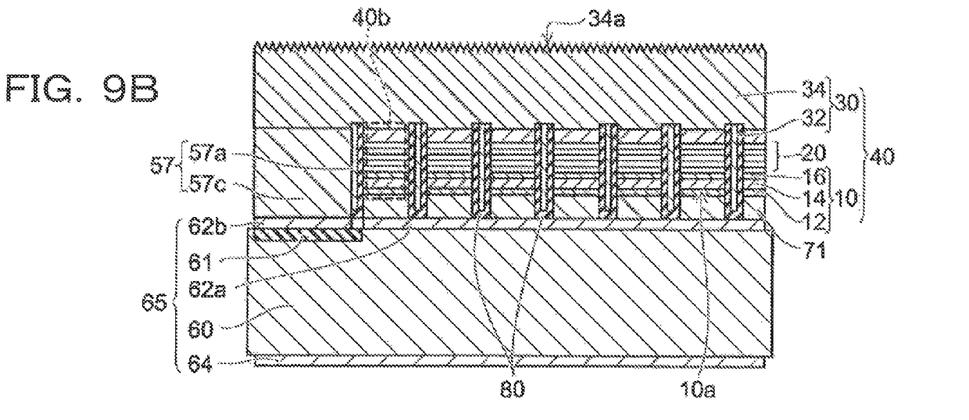
FIG. 9B is a schematic sectional view taken along the D-D line.
Figure 9C:
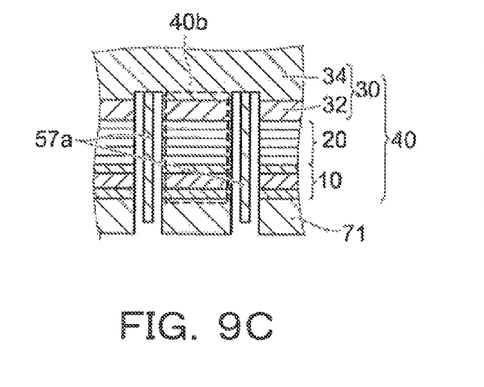
FIG. 9C is a schematic sectional view showing a convex portion of a laminated body.
Figure 9D:
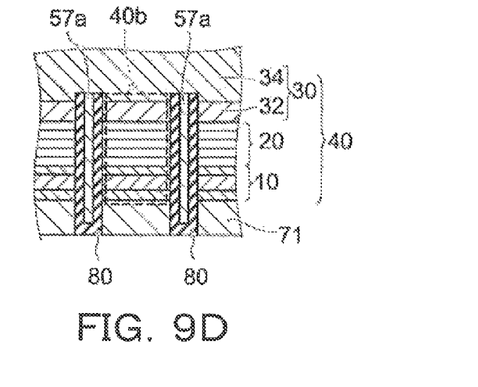
FIG. 9D is a schematic sectional view showing an insulating film.

FIG. 9A is a schematic plan view showing a nitride semiconductor light-emitting element in accordance with a fourth embodiment. FIG. 9B is a schematic sectional view taken along the D-D line. FIG. 9C is a schematic sectional view showing a convex portion of a laminated body. FIG. 9D is a schematic sectional view showing an insulating film. The nitride semiconductor light-emitting element includes the laminated body 40, the first electrode 57, the second electrode 71, and the insulating film 80. The laminated body 40 is made up of nitride semiconductors, and includes the light-emitting layer 20. Alternatively, the laminated body 40 may include a light-emitting layer 21 instead of the light-emitting layer 20.

The laminated body 40 includes two or more convex portions 40b, each of which is regular hexagonal in shape, and reaches a portion of the second layer 30 from the surface of the first layer 10.

As shown in FIGS. 9A and 9C, the connections 57a of the first electrode 57 are formed in a net-like fashion to surround the outer sidewalls of two or more convex portions 40b. As shown in FIG. 9D, gaps between convex portions 40b, each being surrounded by the insulating film 80, are filled with the connection 57a of the first electrode 57. The connection 57a of the first electrode 57 protrudes into the second layer 30 by a prescribed height. When the second electrode 71 is made up of Au, Ag, etc., light emitted from the light-emitting layer 20 to the lower side will be reflected at the second electrode 71 to thereby enhance efficiency of light extraction from the upper side.

Alternatively, the nitride semiconductor light-emitting element may further include a support. The upper electrode of the support 65 includes a region 62a and a region 62b. The region 62a is connected to the second electrode 71 that is formed on the convex portions 40b of the laminated body 40. The region 62b is connected to an extracting portion 57c of the first electrode 57. The region 62b is on an insulating layer 61 formed on the substrate 60. As shown in FIGS. 9A and 9B, the insulating film 80 is formed between the extracting portions 57b, 57c and the connections 57a adjacent to the portions 57b, 57c.

If the convex portions 40b are quadrate in planar form, a variation of the carrier density in the diagonal direction is larger than the variation in vertical and horizontal directions. By contrast, the fourth embodiment has the convex portions 40b with a planar shape of a regular hexagon, so that distances between two centers of hexagonal columns adjacent to each other become equal. The shape of the convex portion 40b uniforms a density distribution of the carriers injected into the convex portion 40b to enhance luminous efficiency.

The first to fourth embodiments uniform the density distribution of the carriers, and reduce a maximum variation of the carrier density. As a result, the embodiments reduce the Auger recombination probability to enhance luminous efficiency and light outputs.

While certain embodiments have been, described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nitride-semiconductor light-emitting element, the element comprising:
    a laminated body made up of nitride semiconductors, the laminated body including a first layer including a first conductivity-type layer, a second layer including a second conductivity-type layer, and a light emitting layer sandwiched between the first layer and the second layer;
    a first electrode including a plurality of connections, the plurality of connections being provided inside the laminated body so as to extend to a portion of the second layer from a surface of the first layer, the plurality of connections protruding into the second layer at a prescribed height and being separated from one another by equal distances so that six of the connections are located at respective corners of a regular hexagon and one connection is located at a center of the hexagon; and a second electrode provided on the first layer.

2. The element according to claim 1, further comprising an insulating film to insulate the first electrode and the second electrode from each other, a portion of the insulating film being provided between each of the plurality of connections and the laminated body.

3. The element according to claim 1, wherein
the light-emitting layer has a multiple quantum well structure including undoped well layers and second conductivity-type barrier layers.

4. The element according to claim 1, wherein
a surface of the second layer includes a concavoconvex portion.

5. The element according to claim 1, further comprising a conductive support to support the laminated body on a side of the first electrode.

6. The element according to claim 1, wherein
the second electrode is a metal electrode to reflect light emitted from the light-emitting layer.

* * * * *